(12) United States Patent
Murthy et al.

(10) Patent No.: US 7,889,820 B2
(45) Date of Patent: Feb. 15, 2011

(54) PHASE COMPENSATION FOR ANALOG GAIN SWITCHING IN OFDM MODULATED PHYSICAL CHANNEL

(75) Inventors: Vinay Murthy, San Diego, CA (US); Linbo Li, San Diego, CA (US); Raghuraman Krishnamoorthi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 858 days.

(21) Appl. No.: 11/393,128

(22) Filed: Mar. 29, 2006

(65) Prior Publication Data

US 2007/0164822 A1 Jul. 19, 2007

Related U.S. Application Data

(60) Provisional application No. 60/756,979, filed on Jan. 5, 2006.

(51) Int. Cl.
*H04L 27/08* (2006.01)
*H04B 17/02* (2006.01)

(52) U.S. Cl. .................................. 375/345; 455/138

(58) Field of Classification Search .............. 375/345, 375/316, 344, 295; 455/138, 241.1, 245.2, 455/251.1, 234.1; 348/678
See application file for complete search history.

(56) References Cited

U.S. PATENT DOCUMENTS

| | | | |
|---|---|---|---|
| 6,463,266 B1 | 10/2002 | Shohara | |
| 6,804,501 B1 * | 10/2004 | Bradley et al. | 455/138 |
| 7,024,169 B2 | 4/2006 | Ciccarelli et al. | |
| 7,076,225 B2 | 7/2006 | Li et al. | |
| 7,457,366 B2 | 11/2008 | Maltsev et al. | |
| 2002/0073436 A1* | 6/2002 | Cowley et al. | 725/131 |
| 2002/0160734 A1 | 10/2002 | Li et al. | |
| 2002/0186796 A1* | 12/2002 | McFarland et al. | 375/341 |
| 2004/0066861 A1* | 4/2004 | Song et al. | 375/316 |
| 2005/0282581 A1* | 12/2005 | Simmons et al. | 455/556.1 |

(Continued)

FOREIGN PATENT DOCUMENTS

WO 05002074 1/2005

OTHER PUBLICATIONS

International Search Report-PCT/US07/060189-International Search Authority-European Patent Office-Mar. 19, 2008.

(Continued)

*Primary Examiner*—Khai Tran
(74) *Attorney, Agent, or Firm*—Gerald P. Joyce, III

(57) ABSTRACT

A control of an amplifier in an automatic gain control (AGC) loop, e.g. in the RF front end circuitry of an OFDM receiver, provides phase adjustment control data to an associated automatic frequency control (AFC), to compensate for a phase jump that would otherwise be caused by switching of the AGC gain between discrete gain states. In the disclosed example, for each gain state, comparators detect a signal energy estimate crossing either a high threshold or a low threshold. Upon threshold crossing, multiplexers select compensation data corresponding to the necessary transition from the prior state to the new state determined by the comparators, based on identification of the prior state and on the particular threshold that has been crossed (high or low). The phase compensation data supplied to the AFC, for one interval corresponding to the timing of the gain switching, adjusts phase rotation implemented in the AFC.

57 Claims, 7 Drawing Sheets

U.S. PATENT DOCUMENTS

2006/0171487 A1* 8/2006 Nawa et al. ................. 375/326

OTHER PUBLICATIONS

Written Opinion-PCT/US07/060189-International Search Authority-European Patent Office-Mar. 19, 2008.

International Preliminary Report on Patentability - PCT/US07/060189 - The International Bureau of WIPO - Geneva, Switzerland - Jul. 8, 2008.

Taiwanese Search Report - 096100495 - TIPO - Mar. 19, 2010 (051351).

* cited by examiner

PHASE COMPENSATION FOR ANALOG GAIN SWITCHING IN OFDM MODULATED PHYSICAL CHANNEL

CLAIM OF PRIORITY UNDER 35 U.S.C. §119

The present Application for Patent claims priority to Provisional Application No. 60/756,979 entitled "PHASE COMPENSATION FOR ANALOG GAIN SWITCHING" filed Jan. 5, 2006, the entire disclosure of which is hereby expressly incorporated by reference herein.

BACKGROUND

1. Field

The present subject matter relates generally to phase compensation in the context of gain switching of an automatic gain control, for example, as might be used in front-end processing of signals to be supplied to an Orthogonal Frequency Division Multiplex (OFDM) receiver.

2. Background

Wireless communication systems are widely deployed to provide various types of communication such as voice, data, and so on. Wireless communications may utilize a number of different multiplexing techniques. One such technique that is becoming increasingly common is Orthogonal Frequency Division Multiplexing or "OFDM." OFDM effectively partitions an operating radio frequency (RF) band into a number of frequency sub-channels. Each sub-channel uses a respective sub-carrier. The precise frequency spacing among the sub-carriers provides the "orthogonality." High-rate data is effectively transmitted in parallel as a set of parallel low data rate streams, on the OFDM sub-carriers. In a given transmission burst, each sub-channel transmits one data symbol. More specifically, data bits intended for transmission are grouped and encoded into symbols. During each burst, one of the coded symbols is modulated on one of the sub-carriers, e.g. using QAM or QPSK modulation. As a result, during one such burst, the N sub-carriers carry N symbols in parallel.

Front-end processing in wireless receivers, including OFDM receivers, often involves an automatic gain control (AGC) function, which effectively normalizes the level of the input signal, for example, to limit the distortion level, before demodulation. AGC also is used in a variety of other signal processing applications. Essentially, amplification or attenuation is applied to the signal, based on a comparison of signal strength to a threshold level.

Many signal processing implementations for wireless receiver circuitry or the like involve conversion from analog to digital form. In wireless receivers, for example, the demodulation and subsequent decoding are performed in digital signal processing. In such signal processing circuits, AGC typically is performed as part of the analog processing prior to the analog to digital conversion, although some implementations also provide controlled digital gain processing, e.g. by a digital variable gain amplifier (DVGA). For example, as the energy of the received radio frequency (RF) signal varies, the AGC keeps the energy seen by the A/D converter within bounds, by either attenuating or amplifying the input signal.

However, where the gain applied by the AGC across a broad spectrum band such as a band containing the sub-carriers of an OFDM communication, AGC switching or stepping of the gain between discrete states can introduce phase jump in the attendant RF down-conversion. The phase error in the signal can cause packet errors and thus decreased receiver performance. Hence, a need exists for a technique to effectively compensate for a phase jump caused by the switching of the gain of the AGC between discrete states or steps.

SUMMARY

The examples discussed below provide compensation of a phase jump that might otherwise result from the gain switching, in response to the activation of the gain switching in an automatic gain control circuit. Although advantages are discussed in the context of a front end circuit for use with an OFDM receiver, those skilled in the art will recognize that the compensation scheme is applicable in other circuits using AGC that may be sensitive to sudden phase changes.

For example, the detailed description discloses a technique for automatic gain control comprising comparing a parameter value related to signal level of a received signal being processed through an amplifier to a threshold, for a first discrete gain state of amplification or attenuation of an amplifier. Upon determining that the parameter value has crossed the threshold, the amplification or attenuation of the amplifier is switched to a second discrete gain state. The technique also entails compensating for a phase jump of a signal output from the amplifier caused by the switching of the amplification or attenuation of the amplifier to the second discrete gain state.

In the specific example, at least one signal output from the amplifier is converted from analog to digital samples. For a wireless receiver application, such as front end signal processing for an OFDM demodulator, the signal form the amplifier is analog and is converted to in-phase (I) and quadrature (Q) components, which in turn are converted to digital samples. The phase jump compensation involves adding selected compensation data corresponding to the switching from the first state to the second state, to phase rotation error compensation processing of the digital samples. The phase jump compensation data is added into the phase rotation error processing, for a single sample interval. That interval corresponds to a sample interval subject to the switching of the amplification or attenuation of the amplifier to the second discrete gain state, e.g. to insure applying the phase jump compensation to the I and Q samples for the appropriate interval when they have propagated through the circuit to the AFC.

In practice of the example, the comparing step typically involves comparing of the parameter value, e.g. an integrated energy error estimate, to high a threshold and a low threshold. When the parameter exceeds the high threshold, then the second discrete gain state is lower than the first discrete gain state However, when the parameter value falls below the low threshold, then the second discrete gain state is higher than the first discrete gain state. The added compensation data corresponds to the particular transition, that is to say from the prior (first) state to the higher or lower second gain state. Hence, for a transition to a lower state, the compensation data value is selected from among a plurality of compensation data values corresponding to possible state transitions from higher discrete gain states to lower discrete gain states, in response to the first discrete gain state. However, for a transition to a higher state, the compensation data value is selected from among a plurality of compensation values corresponding to possible state transitions from lower discrete gain states to higher discrete gain states, in response to the first discrete gain state.

Also disclosed is a signal processing circuit. The circuit comprises an amplifier having a controlled gain, for amplifying a received signal, an automatic frequency control (AFC), and a controller. The controller detects a parameter of the received signal in response to the samples, to control switching of the amplifier between discrete gain states. The controller also provides phase compensation data to the AFC in response to each respective instance of switching of the amplifier between discrete gain states. This data enables the AFC to compensate for phase jump due to the respective instance of switching of the amplifier between discrete gain states.

In a specific example of this circuit, the AFC comprises a phase rotator. The phase rotator includes a frequency accumulator for accumulating a frequency error and a phase accumulator for accumulating a phase error. An adder adds the accumulated frequency error to a prior value of phase error from the phase accumulator, to form a new value of accumulated phase error in the phase accumulator. A sine-cosine lookup table provides sine and cosine values for multiplication of the I and Q samples, in response to the new value of accumulated phase error. For phase jump compensation, the controller supplies the phase compensation data to the adder for addition with the accumulated frequency error and the prior value of phase error from the phase accumulator, to form the new value of accumulated phase error in the phase accumulator, in sample intervals coinciding with I and Q samples impacted by respective instances of gain switching.

The present disclosure also encompasses application of these various teachings in the context of a radio-frequency (RF) signal processing circuit. Such a circuit might include an analog amplifier having a controlled gain, for amplifying a received RF signal. An analog to digital converter enables conversion of at least one amplified RF signal from the amplifier to digital samples. In the examples, the D/A converter converts I and Q signals to digital samples. A digital variable gain amplifier (DVGA) processes the digital samples to implement amplification in the digital domain. The RF processing circuit also includes an automatic frequency control (AFC), for processing samples from the DVGA to correct for phase and frequency tracking errors, and a control circuit. The control circuit detects a parameter of the received RF signal in response to the samples from the DVGA and controls switching of the analog amplifier between discrete gain states based on the detected parameter. The control circuit also provides phase compensation data to the AFC in response to each respective instance of switching of the analog amplifier between discrete gain states, so as to compensate for phase jump due to the respective instance of switching between discrete gain states.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of the methodologies, instrumentalities and combinations particularly pointed out in the appended claims.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and circuitry have been described at a relatively high-level, without detail, in order to avoid unnecessarily obscuring aspects of the present teachings.

Figure 2:
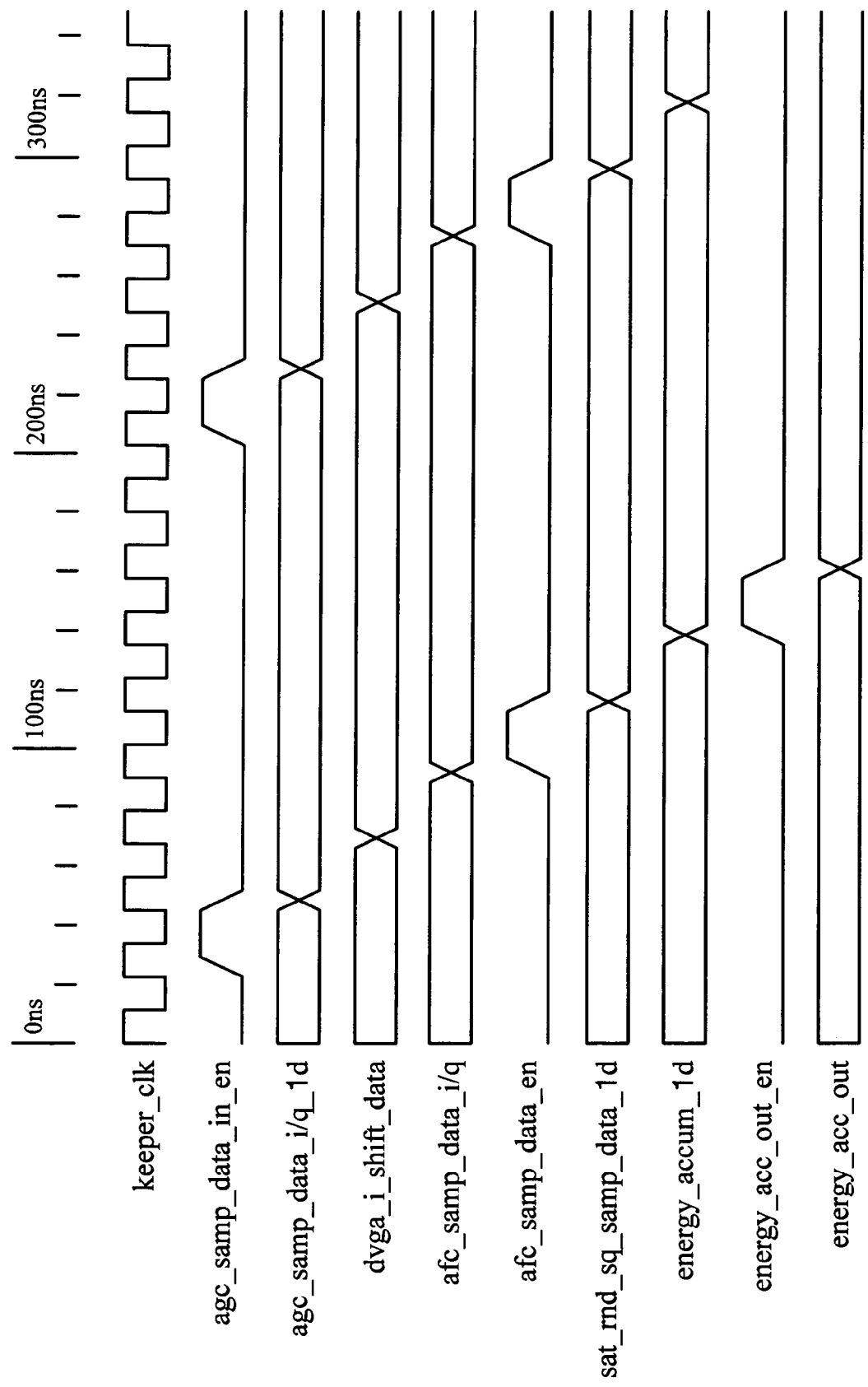
FIGS. 2 and 3 are timing diagrams relating to operations of the AGC/DVGA loop of FIG. 1.
Figure 3:
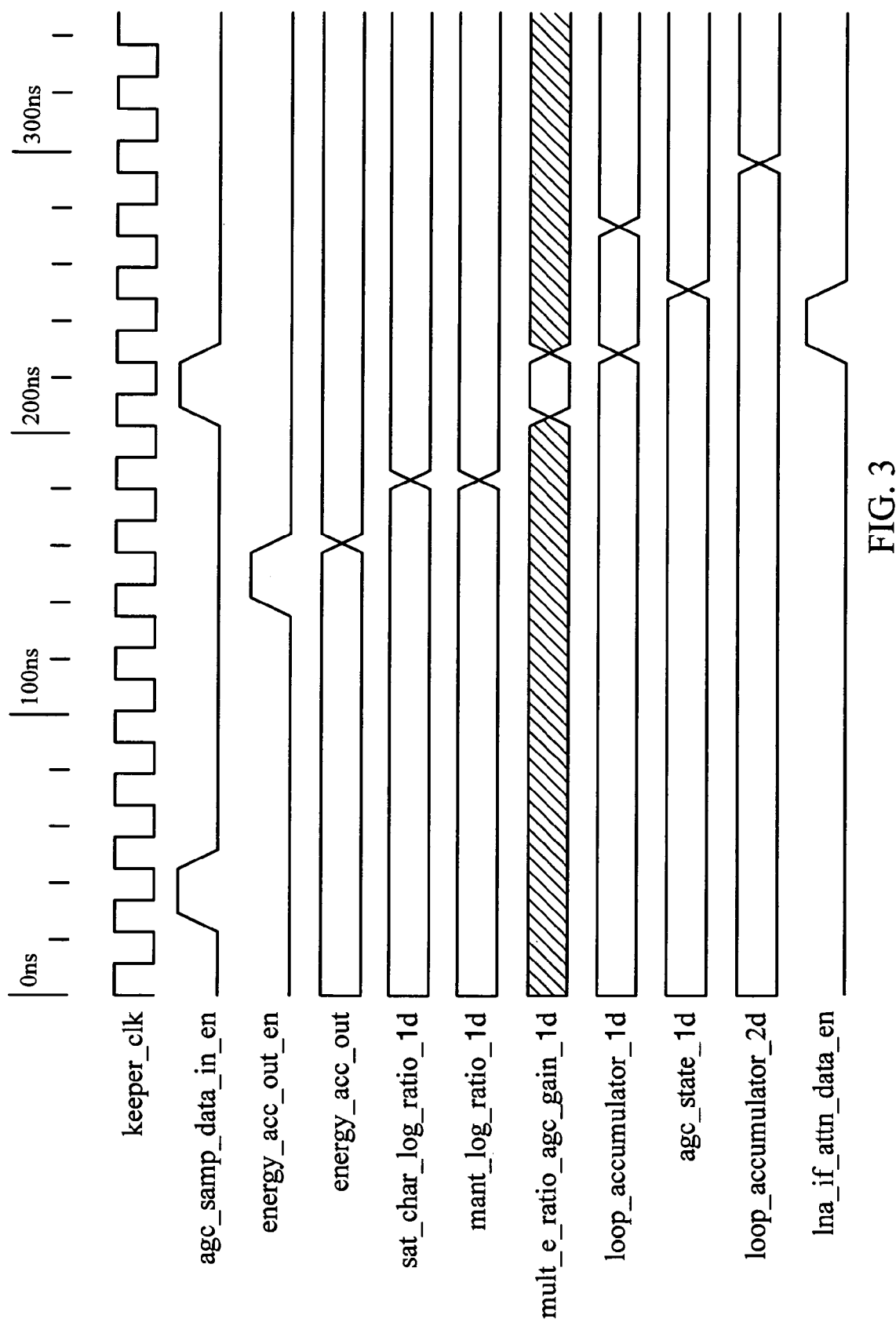

The exemplary signal processing techniques and associated circuits discussed below relate to compensation of phase jump caused by gain switching in an AGC functionality, e.g. as might be applied in the front end curcuit 11 of an OFDM receiver 13 or the like, as shown by way of example in the high level block diagram of FIG. 1. The phase jump compensation may be applied in a variety of different circuits that implement gain switching as part of or in association with an AGC functionality. In the example, the compensation is implemented by appropriate control of an automatic frequency control (AFC) curcuit 33, when implementing gain switching decisions. To fully appreciate the context of the gain control and phase compensation, it may be helpful first to discuss an example of an overall circuit in which these functions may be provided, such as that shown in FIG. 1. FIGS. 2 and 3 are timing diagrams relating to operations of the AGC/DVGA in the curcuit 11 of FIG. 1.

In a wireless application, the analog input signal, e.g. from an antenna (not shown), is applied to a low-noise amplifier (LNA) in curcuit 15, which also implements a zero intermediate frequency (ZIF) type down-conversion of the RF signal to baseband in-phase (real) and quadrature (imaginary) components. Essentially, the ZIF portion of the curcuit 15 multiplies the amplified RF input signal by a local oscillator signal $\cos(\omega t)$ to produce an I in-phase signal, and it 15 multiplies the amplified RF input signal by a local oscillator signal $\sin(\omega t)$ to produce a quadrature (Q) signal. The LNA implements steps or shifts its amplification gain from one state to another, in response to a control signal from a serial bus interface (SBI) circuit 31, to provide the analog AGC function, as will be discussed in more detail, later.

The A/D converter 17 that follows converts each baseband analog signal (for I and Q) to the digital domain. The A/D converter supplies the digital I and Q sample values to a processing curcuit 19 for removal of DC offset. Essentially, the processing circuit processes the digital I and Q sample values to adjust the values so as to remove any DC components.

The gain compensation in the illustrated front end curcuit 11 consists of two stages: an analog gain correction applied before A/D conversion and a digital gain correction applied after the A/D conversion followed by reduction of the bit width of the received samples. In the illustrated arrangement, the analog gain correction before A/D conversion is implemented as part of the LNA in the block/curcuit 15, that is to say by controlled stepping between gain states. The digital gain correction applied after the A/D conversion is implemented by a digital variable gain amplifier (DVGA) 21. The AGC/DVGA feedback loop causes the receiver to become insensitive to signal power variations. Gain control is performed by coupling continuous digital control with discrete gain steps in the analog domain.

The DVGA block 21 receives its inputs from the dc_offset block 19 after the input samples for I and Q have been corrected for the dc offset. In an example, the samples are 15 bits each and are clocked in using a strobe provided by the dc_offset block 19. A software-programmable multiplexer (not separately shown) at the input allows I and Q samples to be swapped.

After gain processing, the I and Q samples output from the DVGA curcuit 21 are supplied as output signals from the front end circuitry 11 to the demodulation processing section of the OFDM receiver 13, via an automatic frequency control (AFC) curcuit 33, to be discussed later. However, these samples are also processed through the feedback loop to control of the AGC/DVGA functions. A parameter value related to the signal being processing is compared to one or more threshold values. For that purpose, the I and Q samples output from the DVGA curcuit 21 also go to an energy estimate circuit block 23.

Although other signal level parameters may be used for AGC functions, the example uses an energy estimate, responsive to the samples output from the DVGA 21. Hence, the curcuit 23 processes the I and Q samples from the DVGA curcuit 21 to estimate the energy or signal strength of the received RF signal. In the exemplary OFDM application, for example, the energy estimate block 23 provides two modes of operation—acquisition and tracking. During acquisition, energy estimation uses the last 128 samples of the 256 sample duration to generate an energy estimate. After the detection of a TDM Pilot1 symbol, the energy estimation is performed once per OFDM symbol using 2048 samples, from sample number 2048 to 4096. The output is generated at sample number 4100 for WIC, LIC and TDM Pilot2 symbols, and for rest of the OFDM symbols; it is generated at sample number 4608. After wakeup from sleep, the acquisition is performed for 16 updates of 256 sample duration each (total number of samples is 4096) and then tracking phase is on.

The timing diagram of processing of the input samples until the calculation of energy estimate is shown in FIG. 2.

The result from the energy estimation is applied to an energy reference block 25, which generates an energy error value from comparison of the estimated energy to one or more reference values. In the example, the energy reference block 25 block receives the normalized energy estimate for both acquisition and tracking. It calculates the log 2(Energy Reference)—log2(Energy Estimate). An example of this data processing might involve counting the number of 0s on the most significant bit (MSB). The number of 0s in the reference is subtracted from the count to generate the reference characteristic. The mantissa is generated by removing the leading 0s in the MSB and taking the next 5 bits as input to agc_log2_lut lookup table to convert. The output of the lookup table is a 6-bit mantissa that is subtracted from the logref mantissa to generate a reference mantissa. The reference characteristic and mantissa are added to generate the energy estimate error with respect to reference in the log2 domain.

The energy estimate error in the log 2 domain (log2(Eref/E) is multiplied by the AGC loop gain, to produce an error value for further processing. The loop gain uses different software-programmable values for acquisition and tracking. The energy reference block 25 supplies the resultant error value to a loop integrator 27.

The initial gain-step values for AGC state transition in the 'up' direction, 0→1, 1→2 and 2→3 are done by software. After sw_callibration_en is made high, the update is done by hardware. The values for AGC transition in the 'down' direction, 3→2, 2→1, 1→0 are negative of their corresponding values in the 'up' direction.

Figure 1:
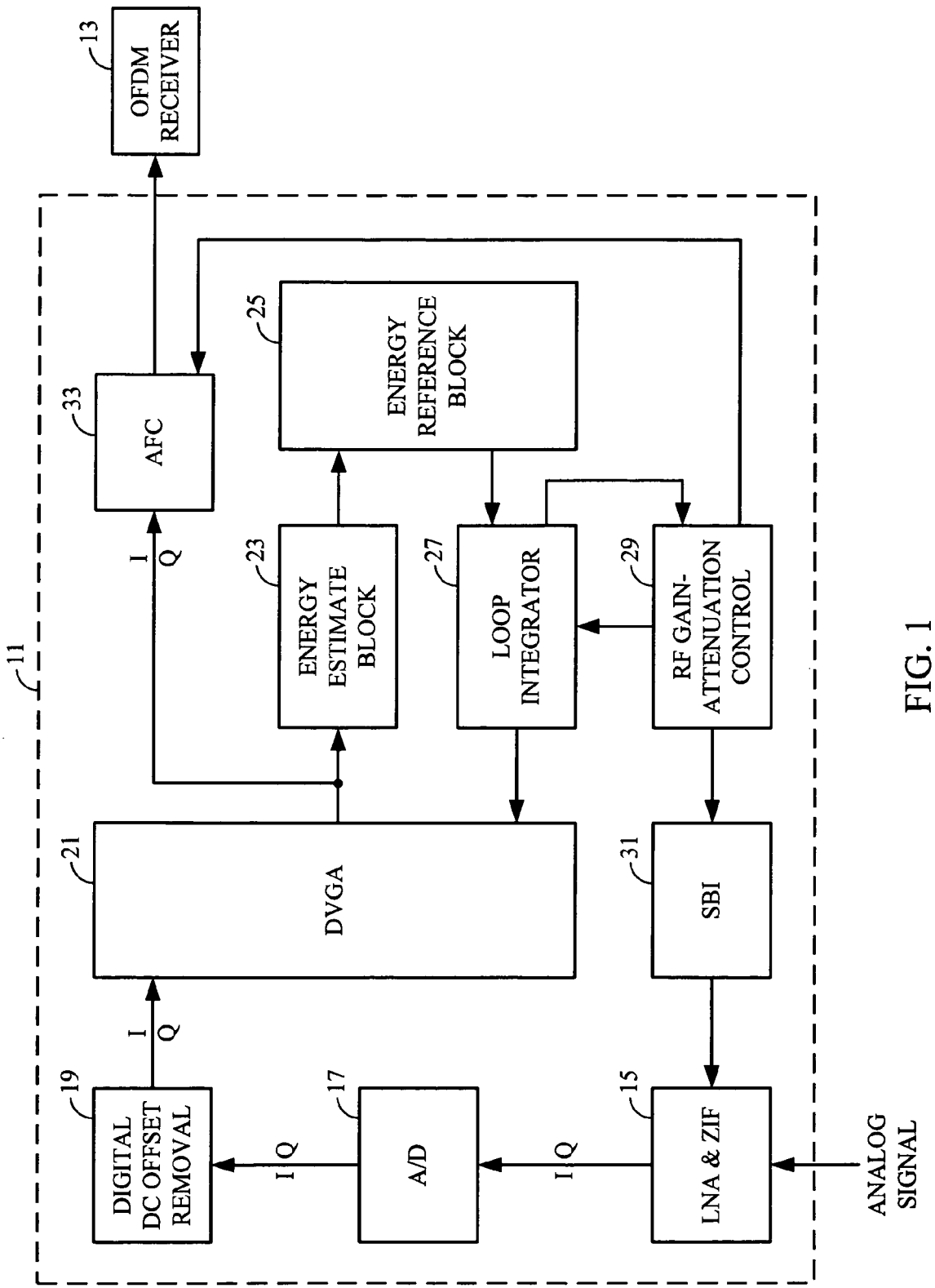
FIG. 1 is a high-level functional block diagram of a front-end circuit and OFDM receiver, wherein the front end signal processing circuit provides an AGC/DVGA loop with compensation for phase jump that otherwise would result from gain shifting of the AGC.

In the system of FIG. 1, the AGC gain state switching or RF attenuation implemented at any given time by the LNA in curcuit 15 depends on the current AGC state and the current value of the loop_accumulator_1$d$ from integrator 27. After the loop_accumulator_1$d$ value is updated in integrator 27, its value is compared with the high and the low threshold. Each gain state has its own software-programmable high and low threshold values. Although different processor architectures may be used, the examples of software selection herein involve use of a multiplexers driven by appropriate selection signals to select data values from registers (or memory locations).

When the loop_accumulator_1$d$ value is less than the low threshold, the signal is too strong, and the control 29 initiates the switch or step up to the next higher discrete attenuation state (lower gain). When the loop_accumulator_1$d$ value is higher than the high threshold, then the signal is too weak, and the control 29 initiates the switch or step down to the lower attenuation state (more gain). Of course, if the loop_accumulator_1$d$ value is between the two thresholds, then the control 29 maintains the current gain state of the AGC functionality on the LNA in the circuit 15.

The description of the AGC/DVGA control loop above is given as one example of signal processing circuit with AGC that can benefit from phase compensation corresponding to switching of gain states. In the example, each occurrence or instance of a switching of the AGC gain from one discrete state to a different discrete state causes a phase jump in the I and Q signals output from the circuit block 15. If not compensated, such a phase jump affects the downstream OFDM demodulation and results in packet errors in receiver 13.

Figure 4:
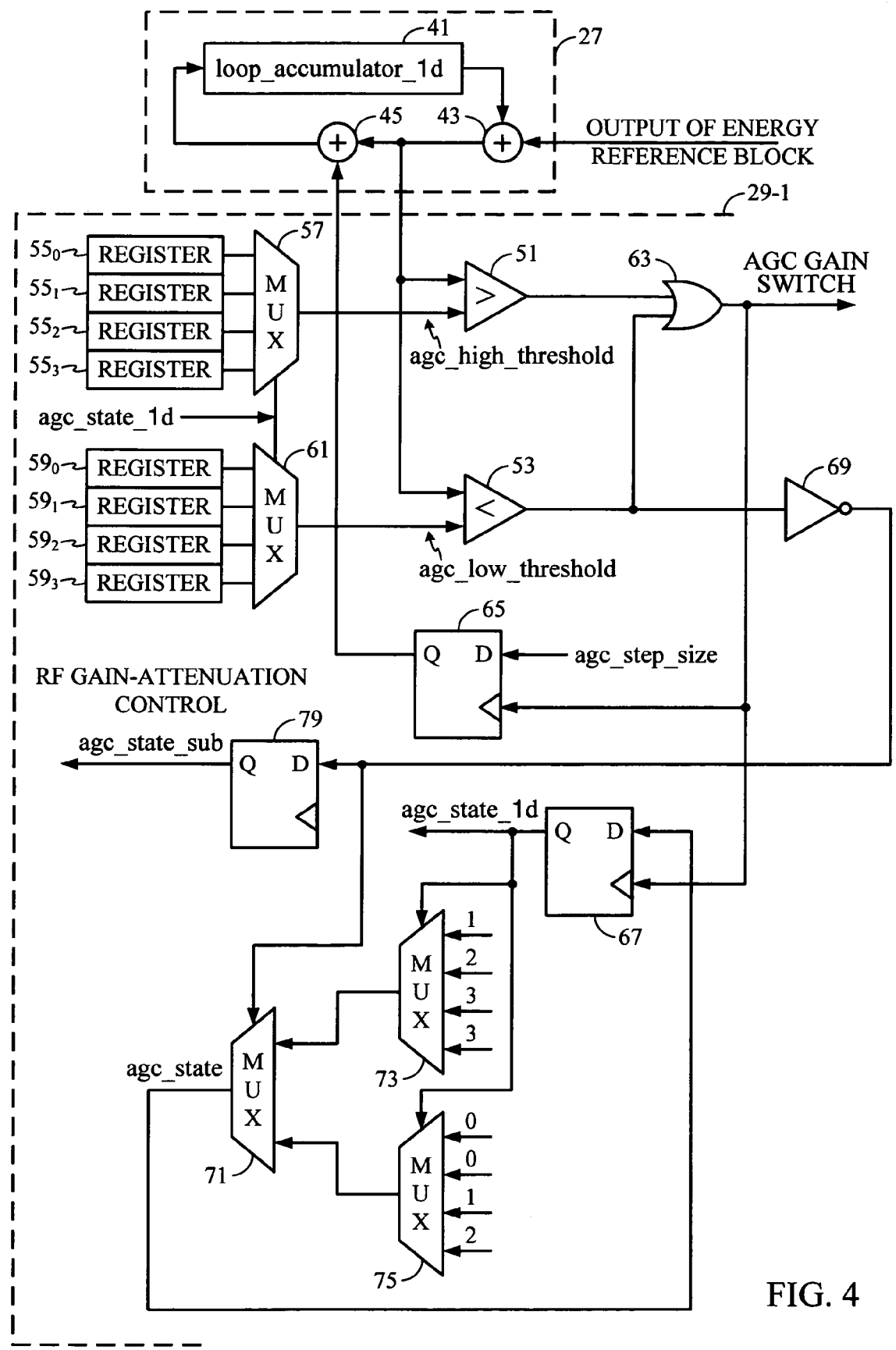
FIG. 4 is a functional block diagram showing the loop integrator and showing somewhat more detail of a first section of the gain-attenuation control circuit, as it relates to AGC and the attendant phase compensation.

As shown in FIG. 4, the loop integrator 27 comprises a register 41 containing the accumulated value loop_accumulator_1$d$ and two adders 43 and 45. The register 41 in the loop integrator 27 is initially loaded with the value of 8192 d, upon reset or software enabling of the AGC function of the signal processing circuit 11. Adder 43 adds each value of the energy estimate error received from the reference block 25 to the previous value loop_accumulator_1$d$ maintained by the register 41 in loop integrator 27, to form the new loop_accumulator_1$d$ value for the current sample interval, as will be used by the control circuitry 29. The adder 45 adds a value from the RF gain-attenuation control circuitry 29 related to gain step size, as discussed below, and feeds the total back to the register 41 to provide a loop_accumulator_1$d$ value for use at the start of the next sample interval.

The RF gain-attenuation control circuitry 29 includes comparators 51 and 53, for comparison to high and low threshold values for the current gain state of the AGC function. Registers 55$_0$ to 55$_3$ hold high threshold values for each of the four possible gain states. A multiplexer (MUX) 57 receives the agc_state_1$d$ signal on its selector input, which indicates the current gain state for the control of the LNA amplifier in circuit 15. In response, the MUX 57 selectively outputs the high threshold value from the register 55 on the MUX input that corresponds to the current value of the agc_state_1d signal and thus corresponds to the current state of the AGC gain. The MUX 57 supplies the selected high value to the agc_high_threshold input of the comparator 51. Similarly, registers $59_0$ to $59_3$ hold low threshold values for each of the four possible gain states. A multiplexer (MUX) 61 receives the agc_state_1d signal indicating the current gain state on its selector input; and in response, the MUX 61 selectively outputs the low threshold value from the register 59 on the MUX input that corresponds to the current value of the agc_state_1d signal and thus corresponds to the current state of the AGC gain. The MUX 61 supplies the selected low value to the agc_low_threshold input of the comparator 53.

Both comparators 51 and 53 receive the new integration value from the loop integrator 27, that is to say, the new loop_accumulator_1d value after addition of the new estimate value by the adder 43. The comparators 51 and 53 compare that new value to the currently selected high and low threshold values respectively, for the current gain state.

The outputs of the comparators 51, 53 are applied as inputs to an OR gate 63. Hence, after the addition of the latest error value to the loop_accumulator_1d value at 43, the control circuitry in block 29 compares the new value against the low threshold and high thresholds of the current gain state, and if either threshold is crossed, the OR gate 63 generates an agc gain state switch command (a 1 value as the AGC Gain Switch signal in the drawing).

The control circuitry in block 29 also adjusts the new loop_accumulator_1d value (after adder 43) by the gain difference between the two states. To that end, the AGC Gain Switch signal acts as an enable signal to a flip-flop 65, which toggles a value corresponding to the step in gain (signal agc_step_size) to the input of the adder 45 in the loop integrator 27.

During gain state switching, the loop_accumulator_1d value goes up and down. The gain provided by the DVGA 21 is responsive to the accumulation in the integrator loop 27. However, to ensure that the DVGA multiplication is always consistent with the current agc state, a holding register—loop_accumulator_2d (not shown) that holds an accumulated value from the integrator loop 27 is only updated after the value for loop_accumulator_1d has settled. In an ASIC implementation, the adjustment of the loop_accumulator_2d is delayed by the software-programmable value to account for the delay in switching of the AGC state in the analog domain.

To switch the gain of the LNA in curcuit 15, the control circuitry in block 29 issues a switch command in the form of a 1 on the AGC Gain Switch line and supplies a new state value. The state value is two bits of control information referred to as the agc_state_1d signal in the drawing. The RF gain-attenuation control circuitry 29 supplies the AGC Gain Switch line command and the new value for the state on the agc_state_1d signal line to an SBI curcuit 31 to provide control signals to switch the gain of the LNA in the curcuit 15 to the new gain level defined by the two-bit state value.

As discussed above, the comparators 51, 53 and OR gate 63 detect if the loop_accumulator_1d value crosses either the low threshold or the high threshold of the current gain state, and if so, the OR gate generates the positive result (1) as the AGC Gain Switch signal. Within the RF gain-attenuation control circuitry 29, the AGC Gain Switch signal goes to the enable input of a flip flop 67. The output of the low threshold comparator 53 also is coupled to an inverter 69, which provides a one-bit selection signal to an agc-state output MUX 71. The Q output of the flip flop 67 is the agc_state_1d signal specifying gain state. Prior to receipt of the new AGC Gain Switch signal on its enable input, the value output by the flip flop 67 represents the old state of the gain. This old state value is provided as a selection input to a high state transition MUX 73 and as a selection input to a low state transition MUX 75.

If the gain switching event (1 on the AGC Gain Switch line) was caused by the loop_accumulator_1d value rising above the high threshold value (agc_high_threshold) for the current state, the 0 on the output of comparator 53 produces a 1 on the output of the inverter 69, causing the MUX 71 to select the transition value from MUX 73, that is to say data specifying the next lower discrete gain state as selected by the MUX 75 in response to the old state signal agc_state_1d from flip-flop 67.

If the gain switching event (1 on the AGC Gain Switch line) was caused by the loop_accumulator_1d value falling below the low threshold value (agc_low_threshold) for the current state, the 1 on the output of comparator 53 produces a 0 on the output of the inverter 69, causing the MUX 71 to select the transition value from the MUX 75, that is to say data specifying the next higher discrete gain state (if not already at the highest gain) from the current state, as selected by the MUX 75 in response to the old state signal agc_state_1d from flip-flop 67.

The data values on the inputs of the MUX 73 represent next lower discrete states, for the possible current gain states indicated by the selection input signal. The data values on the inputs of the MUX 75 represent next higher discrete states, for the possible current gain states. The example provides four possible gain states identified by 0, 1, 2 and 3. The 0 state corresponds to the maximum gain of the LNA amplifier in the curcuit 15, the 1 state corresponds to the next lower/attenuated gain level for use with the weakest input signal, the 1 state corresponds to the next lower gain (somewhat attenuated) level, the 2 state corresponds to a still lower gain (more attenuated) level, and the 3 state corresponds to the most attenuated processing (lowest gain) for use with the strongest input signal.

If the current state is a 1, for example, the next higher discrete gain state would be the 0 state, whereas the next lower discrete gain state would be 2. If the current state is a 2, for example, the next higher gain state would be the 1 state, whereas the next lower gain state would be 3. The gain state can not go higher than 0 and can not go lower than 3.

Hence, in the example, if the gain is already at state 1, when the accumulated value from the integrator 27 goes below the low threshold for the current state, there is a need to decrease gain to that for the 2 state. Hence, the MUX 73 selects the 2 state data, and the MUX 71 selects the data from the MUX 73 to output as the new agc_state signal. In response, the SBI 31 causes the LNA in the curcuit 15 to step up to the gain/attenuation level corresponding to the 2 state. As another example, if the gain is already at 3 (minimum), if the accumulated value from the integrator 27 goes below the low threshold for the current state, the gain can not go any lower, so the new state selected through the MUX 73 and the MUX 71 would still be a 3 gain state, and the LNA continues to operate at its current amplification gain.

As another example, if the gain is already at state 2, when the accumulated value from the integrator 27 goes above the high threshold for the current state, there is a need to increase gain to that for the state 1. Hence, the MUX 75 selects the 1 state data, and the MUX 71 selects the data from the MUX 75 to output as the new agc_state signal. In response, the SBI 31 causes the LNA in the curcuit 15 to step up to the gain/attenuation level corresponding to the 1 state. In another example, if the gain is already at 0 (maximum), the accumulated value from the integrator 27 goes above the high threshold for the current state, the gain can not go any higher, so the new state selected through the MUX 75 and the MUX 71 would still be the 0 gain state, and the LNA continues to operate at its current amplification gain.

Although the connection is not shown in FIG. 4, the MUX 71 supplies the new state identification (agc_state) to the SBI curcuit 31, for use in controlling the LNA in the circuit 15 as described above. The new state identification (agc_state) also goes to the D input of the flip-flop 67, where the enable input from the AGC Gain Switch signal causes the flip-flop to toggle that value through and hold it on the Q output as the updated value for the agc_state_$1d$ signal. Although shown as a single flip-flop 67, the device actually toggles through 2 bits in parallel, for the 2-bits of data to identify one of the 4 possible gain states. So, in practice, the device 67 could for example be implemented by two flip-flops operating in parallel.

In addition, the output from the inverter 69 is applied to the D input of a flip-flop 79, which toggles the bit through and holds the bit as the agc_state_sub signal. As discussed above, the signal output from the inverter 69 indicates which threshold was crossed to trigger a switching of the state of the AGC gain. The inverter output value is a 0 when a signal falls below the low threshold for the prior state, and the inverter output value is a 1 otherwise. The flip-flop 79 holds this value, for use as the agc_state_sub signal, as part of the control of the phase jump compensation discussed below with regard to FIG. 5.

The timing diagram of the feedback loop after calculation of the energy estimate is shown in FIG. 3. In the example, this loop is activated once every 256 samples in acquisition and once every OFDM symbol during tracking.

The switching of the AGC gain causes a phase jump in the I and Q signals output from the circuit block 15. If not compensated, such a phase jump affects the downstream OFDM demodulation and results in packet errors in receiver 13.

The above discussion of the gain switching control implemented in the first portion 29-1 of the RF gain-attenuation control circuitry 29 is given by way of a detailed example, as the phase compensation is implemented in response to the switching of the gain between discrete steps using some of the signals discussed above relative to FIG. 4.

Figure 5:
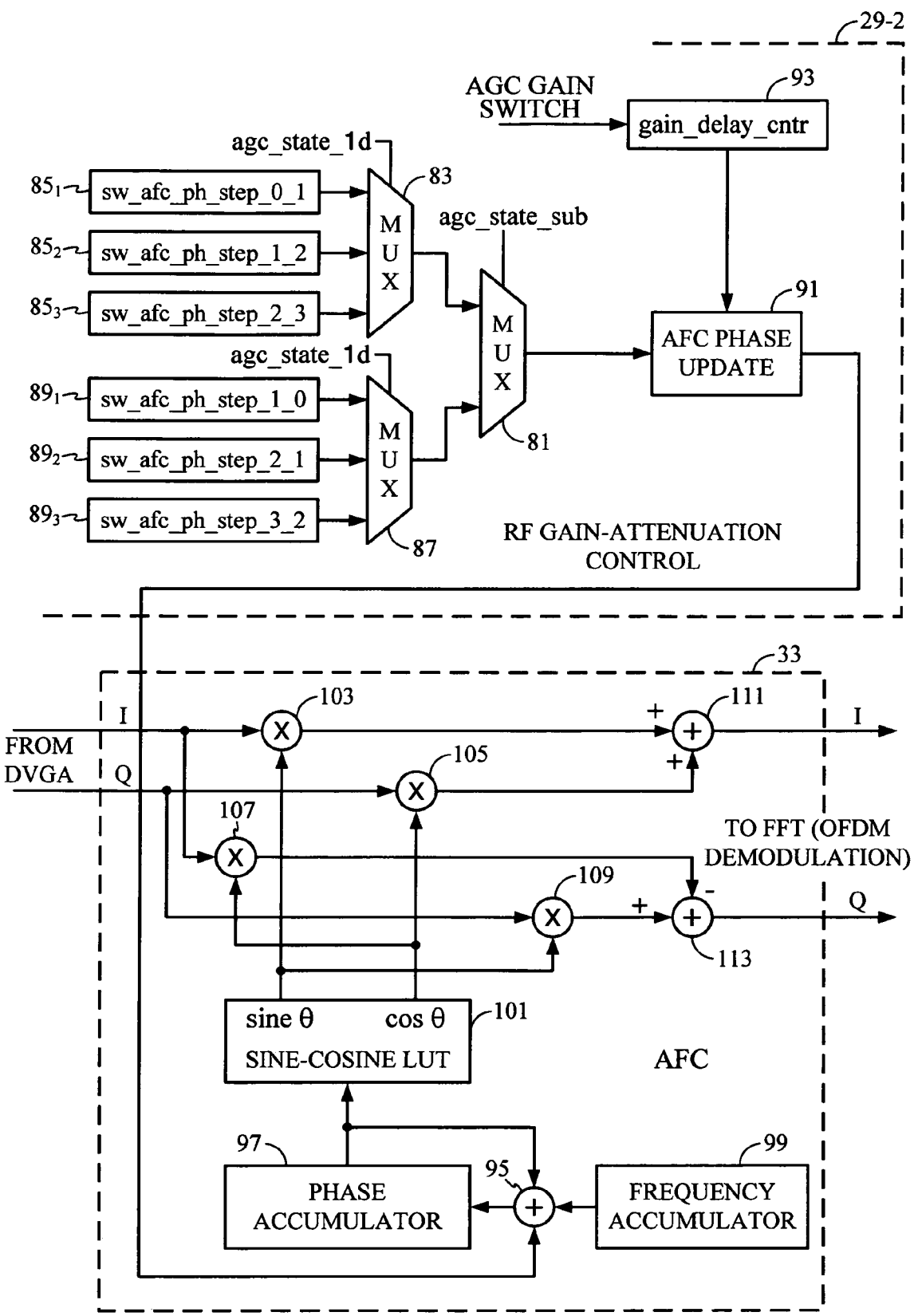
FIG. 5 is a functional block diagram showing the other section of the control circuit and showing an automatic frequency control (AFC) circuit used in an implementation of the phase compensation for gain switching.

FIG. 5 shows the other portion 29-2 of the RF gain-attenuation control circuitry 29, particularly as it relates to the phase jump compensation, and shows the interconnection thereof with elements of the AFC 33 that adjust the phase of the I and Q samples from the DVGA 21, including aspects of the AFC relating to the phase jump compensation.

In general, the phase compensation value is generated in the circuit block 29-2 in response to signals from the circuit block 29-1 (FIG. 4), and the compensation is applied in the AFC block 33. The phase compensation logic is triggered by the AGC gain switching. The possible AGC gain switches are (0→1, 1→0, 1→2, 2→1, 2→3 and 3→2). There are SW programmable registers 85, 89 that correspond to phase compensation for all possible gain switching values. In the block diagram, they are labeled as sw_afc_ph_step_X_Y where the transition is made from X→Y. The value loaded into AFC Phase Update register 91 depends on the current AGC state and the flag (agc_state_sub) that indicates the direction of the switch—stepping up or down. The AFC Phase Update register 91 is loaded by the enable signal generated by the counter (gain_delay_cntr) 93. This counter 93 accounts for the delay in the application of the AGC gain and also reflects the delay in the observed phase jump until the I and Q samples for the appropriate sample interval propagate through to the AFC 33. The AFC Phase Update register 91 holds the phase compensation value for only one sample time. The output of the AFC Phase Update register is added to the Phase Accumulator 97 in the AFC block 33 as a one-shot value.

As shown more specifically in the drawing, a multiplexer 81 selects one of two 8-bit phase compensation values from its inputs, in response to the agc_state_sub signal applied to its selection input. As discussed above, the agc_state_sub signal indicates whether the switching of the gain state was executed in response to a signal falling below the low threshold for the prior state or in response to the signal rising above the high threshold for the prior state.

In response to a 1 as the agc_state_sub signal (low threshold has been crossed), the MUX 81 selects phase jump correction data for a transition to the next lower discrete gain state as output from the MUX 83. The MUX 83 selects the phase jump data for the transition, from an appropriate one of three 8-bit data registers 85$_1$, 85$_2$ and 85$_3$. Each register 85 stores an 8-bit data value, for phase jump correction, for a gain switching from one state down to the next lower gain state. In this example, the data register 85$_1$ holds the correction data sw_afc_ph_step_0_1 for the step transition from state 0 down to state 1. Similarly, the data register 85$_2$ holds the correction data sw_afc_ph_step_1_2 for the step transition from state 1 down to the state 2 and the data register 85$_3$ holds the correction data sw_afc_ph_step_2_3 for the step transition from state 2 down to the state 3. The MUX 83 selects the correction data for the step down to the next lower gain state from the appropriate register, based on the current gain state, as indicated by the agc_state_$1d$ signal from the flip-flop 67 (FIG. 4).

In response to a 0 as the agc_state_sub signal (high threshold has been exceeded), the MUX 81 selects phase jump correction data for a transition to the next higher discrete gain state as output from the MUX 87. The MUX 87 selects the phase jump data for the transition, from an appropriate one of three 8-bit data registers 89$_1$, 89$_2$ and 89$_3$. Each register 89 stores an 8-bit data value, for phase jump correction, for a gain switching from one state up to the next higher gain state. In this example, the data register 89$_1$ holds the correction data sw_afc_ph_step_1_0 for the step transition from state 1 up to state 0. Similarly, the data register 89$_2$ holds the correction data sw_afc_ph_step_2_1 for the step transition from state 2 up to the state 1; and the data register 89$_3$ holds the correction data sw_afc_ph_Step_3_2 for the step transition from state 3 up to the state 2. The MUX 87 selects the correction data for the step down to the next lower gain state from the appropriate register, based on the current gain state, as indicated by the agc_state_$1d$ signal from the flip-flop 67 (FIG. 4).

Hence, when there is a switch between discrete gain states, the MUX 81 will output the 8-bits of phase jump correction data selected in accord with the particular state transition. The MUX 81 supplies this data the AFC phase update register 91. The AFC phase update register 91 is enabled by a control signal from a counter 93. The value of the counter (gain_delay_cntr) corresponds the time for a sample to propagate through from time of receipt in the circuitry 15, through the A/D converter 17, the digital DC offset removal curcuit 19 and the DVGA 21 to the AFC 33. The counter 93 is triggered in response to the AGC gain switch signal. The counter times out when the I and Q samples corresponding to the time of the switching in the curcuit 15 reach the AFC 33, for phase rotation processing by the circuitry of the AFC 33. At that time, the counter 93 times out, and it activates the AFC phase update register 91. In response, the register 91 receives the selected 8-bit correction data from the MUX 81 and supplies that data for one sample interval, to AFC 33.

In the illustrated system, any gain state switching is accompanied with a compensatory phase adjustment, that is to say to compensate for phase jump due to the change in gain state. The software can program a phase jump value for each state transition, via the registers and multiplexers. The AFC phase update register 91 supplies the correction data value to an adder 95, where it is added to the current phase error value from a phase accumulator 97 and the current frequency error value from a frequency accumulator 99. The frequency and phase accumulators maintain running error values for phase and frequency. The phase update value, for phase jump compensation, is added at 95, at the time appropriate for compensation for phase jump caused by the gain shift.

A look-up table (LUT) 101 is used to look up sine and cosine values corresponding to the phase error value from the accumulator 97 and supplied to multipliers 103, 105, 107 and 109. The multiplier 103 multiples each I sample value by the sine output from the sine-cosine LUT 101. The multiplier 105 multiples each Q sample value by the cosine output from the sine-cosine LUT 101. An adder 111 sums the results from the multipliers 103 and 105 to produce an adjusted value for I. The multiplier 107 multiples each I sample value by the cosine output from the sine-cosine LUT 101. The multiplier 109 multiples each Q sample value by the sine output from the sine-cosine LUT 101. The output of the multiplier is applied as a negative input (inverted) of an adder 113. In this way, the adder 113 outputs the difference between the results from the multipliers 109 and 107, to produce an adjusted Q value. The appropriately timed addition of the phase jump correction data for the state transition, from the update register 91 to the adder 95, causes the AFC processing to include that adjustment data in the adjustment of the I and Q values supplied to the Fast Fourier Transform (FFT) in the OFDM demodulation section of the receiver 13, for the I and Q values that would be impacted by phase jump at times of switching between AGC gain states.

The actual phase compensation happens because the one-shot updated Phase Accumulator's value is applied in the phase rotation of the subsequent arriving input I and Q samples. As shown in the block diagram, the phase rotator is implemented as a sine-cosine LUT (Look Up Table) with Phase Accumulator acting as the address and the data output being the sine and cosine of the phase accumulator.

As noted, the AFC Phase Update register 91 holds the phase compensation value for only one sample time. Hence, the output of the AFC Phase Update register is added to the Phase Accumulator value in the AFC block only as a one-shot value at the time appropriate for correction of the I and Q samples corresponding to the latest gain switching.

The phase and frequency accumulators 97, 99, the adder 95 and the LUT 101 implement a phase rotator type compensation for phase and frequency shifts. The actual phase compensation for the gain switch happens because the one-shot updated Phase Accumulator's value (from register 91) is applied in the phase rotation of the subsequent arriving input I and Q samples. As shown in the block diagram, the phase rotator is implemented as a sine-cosine LUT (Look Up Table) 101 with the Phase Accumulator 97 acting as the address. The data outputs of the LUT 101 are the sine and cosine of the phase accumulator value θ.

The essential operation being done by the phase rotator is $$(I+jQ)*e^{-j\theta} = (I+jQ)*(\sine \theta - j\cos \theta) \quad (1)$$

where θ=value from the Phase Accumulator 97 in the diagram.

Now in the analog domain, $$\theta = \omega t + \Phi \quad (2)$$

where ω is the frequency error (output Frequency Accumulator 99 in the diagram), t is time and Φ is the phase jump.

As you can see in equation (2), the θ (from the Phase Accumulator 97) increases linearly in time.

In the digital domain where 't' is replaced by number or sample 'n', $$\theta[n] = \omega n + \Phi$$

$$\theta[n+1] = \omega(n+1) + \Phi$$
$$= \omega n + \Phi + \omega$$
$$= \theta(n) + \omega$$

or

Phase Accumulator at time n+1 is

Phase Accumulator[n+1]=Phase Accumulator[n]+Frequency Accumulator

The phase jump Φ is added only for one-sample after agc gain switching.

Figure 6:
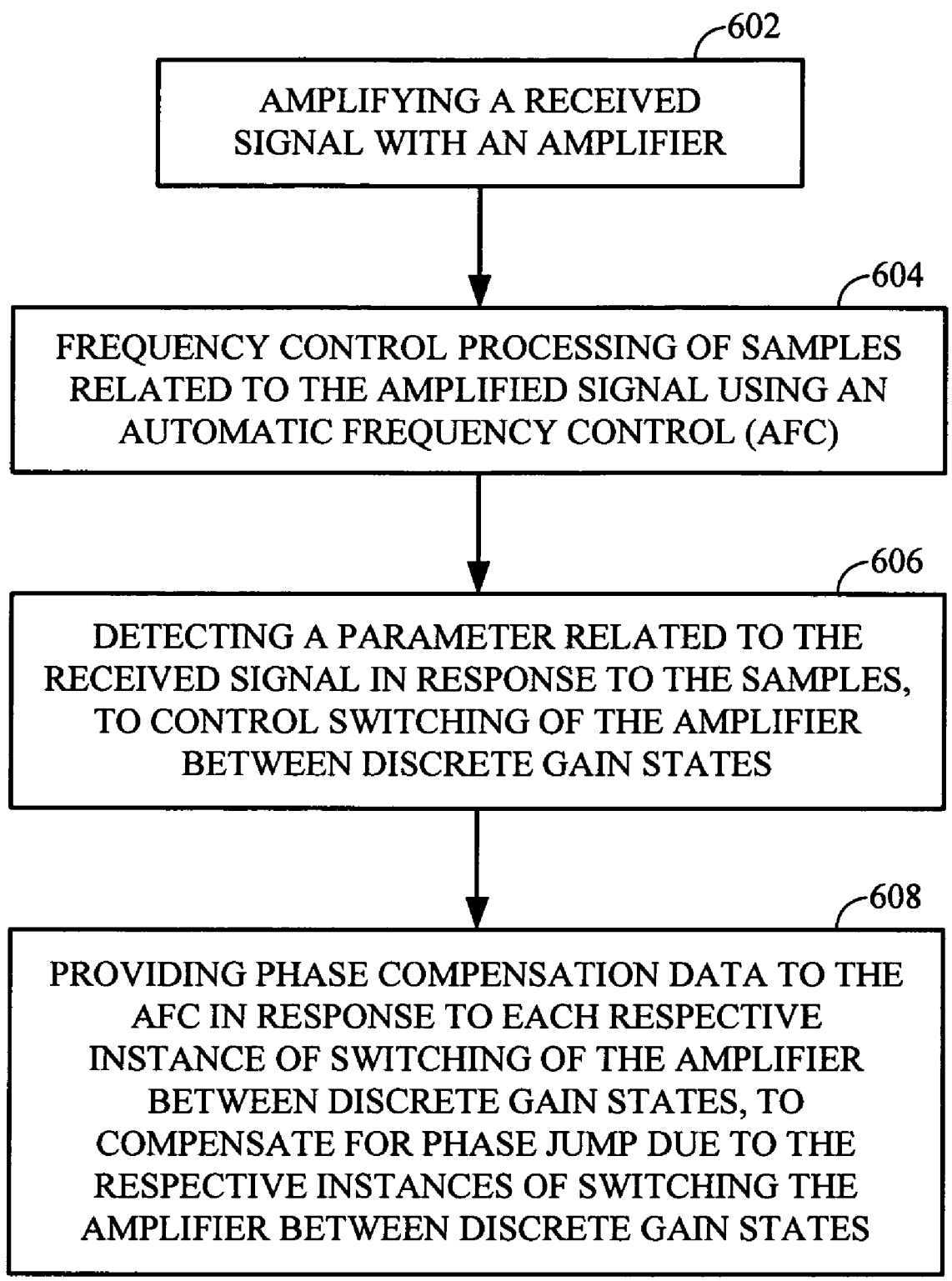
FIG. 6 is a flow chart illustrating the operation of a signal processing circuit.

FIG. 6 is a flow chart illustrating the operation of a signal processing circuit. In step 602, a received signal is amplified by an amplifier. In step 604, samples related to an amplified signal from the amplifier are frequency control processed by an automatic frequency control (AFC) circuit. In step 606, parameter related to the received signal is detected in response to the samples, to control switching of the amplifier between discrete gain states. In step 608, phase compensation data is provided to the AFC in response to each respective instance of switching of the amplifier between discrete gain states, to compensate for phase jump due to the respective instance of switching of the amplifier between discrete gain states.

Figure 7:
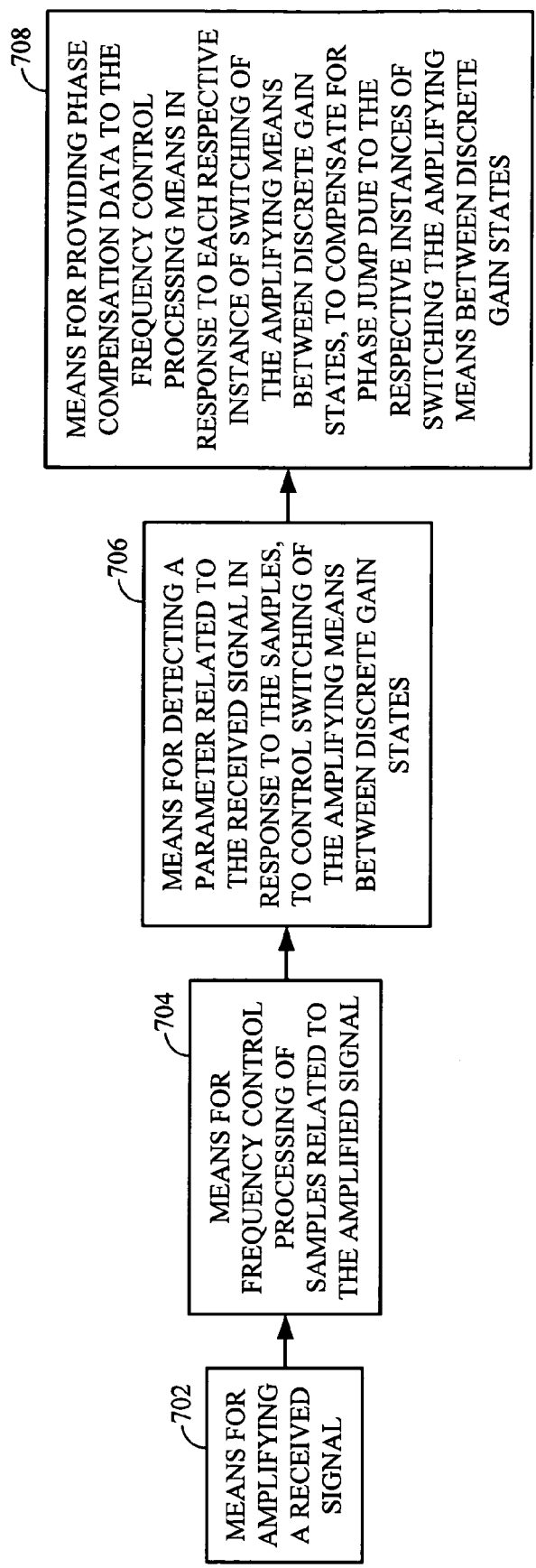
FIG. 7 is a functional block diagram of a signal processing circuit.

FIG. 7 is a conceptual diagram illustrating of a signal processing circuit. The signal processing circuit includes means for amplifying 702 a received signal, and means for frequency control processing 704 of samples related to an amplified signal. The signal processing circuit also includes means for detecting a parameter 706 related to the received signal in response to the samples, to control switching of the amplifying means 702 between discrete gain states, and means for providing phase compensation data 708 to the frequency control processing means 704 in response to each respective instance of switching of the amplifying means 702 between discrete gain states, to compensate for phase jump due to the respective instance of switching of the amplifying means 702 between discrete gain states.

The above description illustrates a specific example of the phase compensation responsive to AGC gain state switching in front end processing of signals for OFDM demodulation. Those skilled in the art will recognize that the advantageous phase compensation may be implemented in a variety of other specific ways and/or for a variety of other signal processing applications.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A method of automatic gain control, comprising:
comparing a parameter value related to a signal level of a received signal being processed through an amplifier to a threshold, the amplifier being in a first discrete gain state of amplification;
switching an amplification of the amplifier to a second discrete gain state upon determining that the parameter value has crossed the threshold;
selecting compensation data corresponding to the switching from the first discrete state to the second discrete state;
accumulating a frequency error based on the received signal;
calculating a sum of at least the compensation data and the accumulated frequency error; and
compensating, based on the sum of at least the compensation data and the accumulated frequency error, for a phase jump of a signal output from the amplifier caused by the switching of the amplification of the amplifier to the second discrete gain state.

2. The method of claim 1, further comprising:
converting signal output from the amplifier from analog to digital samples;
wherein compensating for the phase jump comprises processing a phase rotation error compensation of the digital samples based on the compensation data for a single sample interval corresponding to a sample interval subject to the switching of the amplification of the amplifier to the second discrete gain state.

3. The method of claim 1, wherein comparing the parameter value comprises comparing the parameter value to a high threshold and a low threshold, wherein if the determining results in a determination that the parameter value has exceeded the high threshold, then the second discrete gain state is lower than the first discrete gain state, and if the determining results in a determination that the parameter value has fallen below the low threshold, then the second discrete gain state is higher than the first discrete gain state.

4. The method of claim 2, wherein the digital samples include in-phase (I) and quadrature (Q) samples, and wherein processing the phase rotation error comprises processing the I and Q samples based on:

$$(I+jQ) * e^{-j\theta} = (I+jQ) * (sin\theta - jcos\theta),$$

wherein θ is an accumulated phase error value.

5. The method of claim 4, wherein processing the phase rotation error compensation comprises adding the compensation data to the accumulated phase error value θ.

6. The method of claim 5, further comprising timing the addition of the selected compensation data to the accumulated phase error value θ so as to coincide with the processing of the I and Q samples corresponding to the sample interval subject to the switching of the amplification of the amplifier to the second discrete gain state.

7. The method of claim 3, wherein if the second discrete gain state is lower than the first discrete gain state, then the selected compensation data has a first value, and if the second discrete gain state is higher than the first discrete gain state, then the selected compensation data has a second value different from the first value.

8. The method of claim 7, wherein the first value is selected from among a plurality of compensation data values corresponding to possible state transitions from higher discrete gain states to lower discrete gain states in response to the first discrete gain state, and the second data value is selected from among a plurality of compensation data values corresponding to possible state transitions from lower discrete gain states to higher discrete gain states in response to the first discrete gain state.

9. A method of automatic gain control comprising:
comparing a parameter value related to a signal level of a received signal being processed through an amplifier to a threshold, the amplifier being in a first discrete gain state of amplification;
switching the amplification of the amplifier to a second discrete gain state upon determining that the parameter value has crossed the threshold;
converting signal output from the amplifier from analog to digital samples;
compensating for a phase jump of a signal output from the amplifier caused by the switching of the amplification of the amplifier to the second discrete gain state;
wherein compensating for the phase jump comprises:
selecting compensation data corresponding to the switching from the first state to the second state;
processing a phase rotation error compensation of the digital samples based on the compensation data for a single sample interval corresponding to a sample interval subject to the switching of the amplification of the amplifier to the second discrete gain state; and
wherein the digital samples include in-phase (I) and quadrature (Q) samples; and
wherein processing the phase rotation error compensation comprises processing the I and Q samples based on:

$$(I+jQ) * e^{-j\theta} = (I+jQ)*(sin\theta - jcos\theta),$$

wherein θ is an accumulated phase error value.

10. The method of claim 9, wherein processing the phase rotation error compensation comprises adding the compensation data to the accumulated phase error value θ.

11. The method of claim 10, further comprising timing the addition of the selected compensation data to the accumulated phase error value θ so as to coincide with the processing of the I and Q samples corresponding to the sample interval subject to the switching of the amplification of the amplifier to the second discrete gain state.

12. A method of automatic gain control comprising:
comparing a parameter value related to a signal level of a received signal being processed through an amplifier to a threshold, the amplifier being in a first discrete gain state of amplification;
switching the amplification of the amplifier to a second discrete gain state upon determining that the parameter value has crossed the threshold;
converting signal output from the amplifier from analog to digital samples;
compensating for a phase jump of a signal output from the amplifier caused by the switching of the amplification of the amplifier to the second discrete gain state;
wherein compensating for the phase jump comprises:
selecting compensation data corresponding to the switching from the first state to the second state;
processing a phase rotation error compensation of the digital samples based on the compensation data for a single sample interval corresponding to a sample interval subject to the switching of the amplification of the amplifier to the second discrete gain state;
wherein comparing the parameter value comprises comparing the parameter value to a high threshold and a low threshold, wherein if the determining results in a determination that the parameter value has exceeded the high threshold, then the second discrete gain state is lower than the first discrete gain state, and if the determining results in a determination that the parameter value has fallen below the low threshold, then the second discrete gain state is higher than the first discrete gain state; and wherein if the second discrete gain state is lower than the first discrete gain state, then the selected compensation data has a first value, and if the second discrete gain state is higher than the first discrete gain state, then the selected compensation data has a second value different from the first value.

13. The method of claim 12, wherein the first value is selected from among a plurality of compensation data values corresponding to possible state transitions from higher discrete gain states to lower discrete gain states in response to the first discrete gain state, and the second data value is selected from among a plurality of compensation data values corresponding to possible state transitions from lower discrete gain states to higher discrete gain states in response to the first discrete gain state.

14. A signal processing circuit, comprising:
an amplifier configured to amplify a received signal, wherein the amplifier has a controlled gain;
an automatic frequency control (AFC) configured to perform frequency control processing of samples related to an amplified signal from the amplifier; and
a controller configured to:
detect a parameter related to the received signal in response to the samples;
control switching of the amplifier between discrete gain states based on the detected parameter; and
provide phase compensation data to the AFC in response to each respective instance of switching of the amplifier between discrete gain states;
wherein the AFC comprises a phase rotator comprising:
a frequency accumulator configured to accumulate a frequency error based on the received signal;
an adder configured to calculate a sum of at least the compensation data and the accumulated frequency error; and
wherein, based on the sum of at least the compensation data and the accumulated frequency error, the AFC is configured to compensate for a phase jump due to the respective instance of switching of the amplifier between discrete gain states.

15. The signal processing circuit of claim 14, wherein the amplifier comprises a low noise amplifier configured to amplify a received radio-frequency (RF) signal, and configured to perform a zero intermediate frequency (ZIF) type downconversion of the amplified RF signal to baseband in-phase (I) and quadrature (Q) components, and wherein the samples are digital samples of the baseband I and Q components.

16. The signal processing circuit of claim 15, wherein the detected parameter is an integral of an error of an energy estimate of the received signal based on processing of the samples of the I and Q components.

17. The signal processing circuit of claim 15, wherein the phase rotator comprises:
a phase accumulator configured to accumulate a phase error;
wherein the adder is further configured to add the accumulated frequency error to a prior value of phase error from the phase accumulator in order to form a new value of accumulated phase error in the phase accumulator; and
a sine-cosine lookup table responsive to the new value of accumulated phase error configured to provide sine and cosine values for multiplication of the I and Q samples.

18. The signal processing circuit of claim 17, wherein the controller is further configured to supply the phase compensation data to the adder for addition with the accumulated frequency error and the prior value of phase error from the phase accumulator, in order to form the new value of accumulated phase error in the phase accumulator, in sample intervals coinciding with I and Q samples impacted by respective instances of gain switching.

19. The signal processing circuit of claim 14, wherein the controller further comprises:
at least one selector configured to select a value of phase compensation data for each respective instance of switching corresponding to one of a plurality of possible switchings between discrete gain states; and
a register configured to supply each selected value of phase compensation data to the AFC for a single sample interval.

20. The signal processing circuit of claim 19, wherein the controller further comprises:
a counter triggered in response to each gain state switching for causing the register to delay supplying the selected value of phase compensation data for the respective instance of gain switching to the AFC for a period corresponding to a time of propagation of a sample subject to phase jump due to the respective instance of gain switching through the signal processing circuit to the AFC.

21. A signal processing circuit, comprising:
an amplifier configured to amplify a received signal, wherein the amplifier has a controlled gain;
an automatic frequency control (AFC) configured to perform frequency control processing of samples related to an amplified signal from the amplifier; and
a controller configured to:
detect a parameter related to the received signal in response to the samples;
control switching of the amplifier between discrete gain states based on the detected parameter; and
provide phase compensation data to the AFC in response to each respective instance of switching of the amplifier between discrete gain states;
wherein, based on the phase compensation data, the AFC is configured to compensate for a phase jump due to the respective instance of switching of the amplifier between discrete gain states;
wherein the amplifier comprises a low noise amplifier configured to amplify a received radio-frequency (RF) signal, and configured to perform a zero intermediate frequency (ZIF) type downconversion of the amplified RF signal to baseband in-phase (I) and quadrature (Q) components; and
wherein the samples are digital samples of the baseband I and Q components.

22. The signal processing circuit of claim 21, wherein the detected parameter is an integral of an error of an energy estimate of the received signal based on processing of the samples of the I and Q components.

23. The signal processing circuit of claim 21, wherein the AFC comprises a phase rotator comprising:
a frequency accumulator configured to accumulate a frequency error;
a phase accumulator configured to accumulate a phase error;
an adder configured to add the accumulated frequency error to a prior value of phase error from the phase accumulator to form a new value of accumulated phase error in the phase accumulator; and a sine-cosine lookup table responsive to the new value of accumulated phase error configured to provide sine and cosine values for multiplication of the I and Q samples.

24. The signal processing circuit of claim 23, wherein the controller is further configured to supply the phase compensation data to the adder for addition with the accumulated frequency error and the prior value of phase error from the phase accumulator, in order to form the new value of accumulated phase error in the phase accumulator, in sample intervals coinciding with I and Q samples impacted by respective instances of gain switching.

25. A signal processing circuit, comprising:
an amplifier configured to amplify a received signal, wherein the amplifier has a controlled gain;
an automatic frequency control (AFC) configured to perform frequency control processing of samples related to an amplified signal from the amplifier; and
a controller configured to:
detect a parameter related to the received signal in response to the samples;
control switching of the amplifier between discrete gain states based on the detected parameter; and
provide phase compensation data to the AFC in response to each respective instance of switching of the amplifier between discrete gain states;
wherein, based on the phase compensation data, the AFC is configured to compensate for a phase jump due to the respective instance of switching of the amplifier between discrete gain states; and
wherein the controller comprises:
at least one selector configured to select a value of phase compensation data for each respective instance of switching corresponding to one of a plurality of possible switchings between discrete gain states; and
a register configured to supply each selected value of phase compensation data to the AFC for a single sample interval.

26. The signal processing circuit of claim 25, wherein the controller further comprises a counter triggered in response to each gain state switching for causing the register to delay supplying the selected value of phase compensation data for the respective instance of gain switching to the AFC for a period corresponding to a time of propagation of a sample subject to phase jump due to the respective instance of gain switching through the signal processing circuit to the AFC.

27. A radio-frequency (RF) signal processing circuit, comprising:
an analog amplifier configured to amplify a received RF signal, wherein the amplifier has a controlled gain;
an analog to digital converter configured to covert an amplified RF signal from the amplifier to digital samples;
a digital variable gain amplifier (DVGA) configured to process the digital samples in order to implement amplification in a digital domain;
an automatic frequency control (AFC) configured to process samples from the DVGA in order to correct for phase and frequency tracking errors; and
a control circuit configured to:
detect a parameter of the received RF signal in response to the samples from the DVGA;
control switching of the analog amplifier between discrete gain states based on the detected parameter; and
provide phase compensation data to the AFC in response to each respective instance of switching of the analog amplifier between discrete gain states; and wherein, based on the phase compensation data, the AFC is configured to compensate for a phase jump due to the respective instance of switching between discrete gain states.

28. The signal processing circuit of claim 27, wherein the control circuit comprises:
at least one selector configured to select a value of phase compensation data for each instance of switching corresponding to one of a plurality of possible switchings between discrete gain states; and
a controller configured to supply each selected value of phase compensation data to the AFC a time after each respective switching of the analog amplifier between discrete gain states, the time corresponding to a time of propagation of a sample through the signal processing circuit to the AFC.

29. The signal processing circuit of claim 27, wherein the AFC comprises a phase rotator, and the control circuit provides the phase compensation data to adjust rotation of the phase rotator.

30. The signal processing circuit of claim 29, wherein the samples from the DVGA include in-phase (I) and quadrature (Q) samples, and the phase rotator comprises:
a frequency accumulator configured to accumulate a frequency error;
a phase accumulator configured to accumulate a phase error;
an adder configured to add the accumulated frequency error to a prior value of phase error from the phase accumulator to form a new value of accumulated phase error in the phase accumulator; and
a sine-cosine lookup table responsive to the new value of accumulated phase error and configured to provide sine and cosine values for multiplication of the I and Q samples so as to correct for phase and frequency errors.

31. The signal processing circuit of claim 30, wherein the control circuit is further configured to:
supply the phase compensation data to the adder for addition with the accumulated frequency error and the prior value of phase error from the phase accumulator in order to form the new value of accumulated phase error in the phase accumulator; and
supply the phase compensation data corresponding to each instance of gain switching for only a single sample interval.

32. Computer readable storage media containing a set of instructions for a processor in a signal processing circuit that includes an amplifier having a controlled gain, for amplifying a received signal, and an automatic frequency control (AFC), for frequency control processing of samples related to an amplified signal from the amplifier, the set of instructions comprising:
a routine to detect a parameter related to the received signal in response to the samples;
a routine to control switching of the amplifier between discrete gain states based on the detected parameter;
a routine to provide phase compensation data to the AFC in response to each respective instance of switching of the amplifier between discrete gain states;
a routine to accumulate a frequency error based on the received signal;
a routine to calculate a sum of at least the compensation data and the accumulated frequency error; and
a routine, based on the sum of at least the compensation data and the accumulated frequency error, to compensate for a phase jump due to the respective instance of switching of the amplifier between discrete gain states.

33. The computer readable storage media of claim 32, wherein the set of instructions further comprises:
- a routine to amplify a received radio-frequency (RF) signal;
- a routine to perform a zero intermediate frequency (ZIF) type downconversion of the amplified RF signal to baseband in-phase (I) and quadrature (Q) components; and
- wherein the samples are digital samples of the baseband I and Q components.

34. The computer readable storage media of claim 33, wherein the detected parameter is an integral of an error of an energy estimate of the received signal based on processing of the samples of the I and Q components.

35. The computer readable storage media of claim 33, wherein the set of instructions further comprises:
- a routine to accumulate a phase error;
- a routine to add the accumulated frequency error to a prior value of phase error in order to form a new value of accumulated phase error; and
- a routine to provide sine and cosine values for multiplication of the I and Q samples.

36. The computer readable storage media of claim 35, wherein the set of instructions further comprises a routine to supply the phase compensation data for addition with the accumulated frequency error and the prior value of phase error in order to form the new value of accumulated phase error, in sample intervals coinciding with I and Q samples impacted by respective instances of gain switching.

37. The computer readable storage media of claim 32, wherein the set of instructions further comprises:
- a routine for selecting a value of phase compensation data for each respective instance of switching corresponding to one of a plurality of possible switchings between discrete gain states; and
- wherein the signal processing circuit comprises a register configured to supply each selected value of phase compensation data to the AFC for a single sample interval.

38. The computer readable storage media of claim 37, wherein the set of instructions further comprises a routine to implement a counter triggered in response to each gain state switching for causing the register to delay supplying the selected value of phase compensation data for the respective instance of gain switching to the AFC for a period corresponding to a time of propagation of a sample subject to phase jump due to the respective instance of gain switching through the signal processing circuit to the AFC.

39. Computer readable storage media containing a set of instructions for a processor in a signal processing circuit that includes an amplifier having a controlled gain, for amplifying a received signal, and an automatic frequency control (AFC), for frequency control processing of samples related to an amplified signal from the amplifier, the set of instructions comprising:
- a routine to detect a parameter related to the received signal in response to the samples;
- a routine to control switching of the amplifier between discrete gain states based on the detected parameter;
- a routine for providing phase compensation data to the AFC in response to each respective instance of switching of the amplifier between discrete gain states, wherein, based on the phase compensation data, the AFC is configured to compensate for a phase jump due to the respective instance of switching of the amplifier between discrete gain states;
- a routine for selecting a value of phase compensation data for each respective instance of switching corresponding to one of a plurality of possible switchings between discrete gain states; and
- wherein the signal processing circuit comprises a register configured to supply each selected value of phase compensation data to the AFC for a single sample interval.

40. The computer readable storage media of claim 39, wherein the set of instructions further comprises:
- a routine to implement a counter triggered in response to each gain state switching for causing the register to delay supplying the selected value of phase compensation data for the respective instance of gain switching to the AFC for a period corresponding to a time of propagation of a sample subject to phase jump due to the respective instance of gain switching through the signal processing circuit to the AFC.

41. A signal processing circuit, comprising:
- means for amplifying a received signal;
- means for frequency control processing of samples related to an amplified signal from the means of amplifying;
- means for detecting a parameter related to the received signal in response to the samples;
- means for controlling switching of the means for amplifying between discrete gain states based on the detected parameter;
- means for providing phase compensation data to the means for frequency control processing in response to each respective instance of switching of the means for amplifying between discrete gain states;
- means for accumulating a frequency error based on the received signal;
- means for calulating a sum of at least the compensation data and the accumulated frequency error; and
- means for compensating, based on the sum of at least the compensation data and the accumulated frequency error, for a phase jump due to the respective instance of switching of the means for amplifying between discrete gain states.

42. (The signal processing circuit of claim 41, wherein the means for amplifying comprises:
- means for amplifying a received radio-frequency (RF) signal;
- means for downconverting, based on a zero intermediate frequency (ZIF) type downconversion, the amplified RF signal to baseband in-phase (I) and quadrature (Q) components; and
- wherein the samples are digital samples of the baseband I and Q components.

43. The signal processing circuit of claim 42, wherein the detected parameter is an integral of an error of an energy estimate of the received signal based on processing of the samples of the I and Q components.

44. The signal processing circuit of claim 42, wherein the means for frequency control processing comprises:
- means for accumulating a phase error;
- means for adding the accumulated frequency error to a prior value of phase error to form a new value of accumulated phase error in the phase accumulator; and
- means for providing sine and cosine values for multiplication of the I and Q samples in response to the new value of accumulated phase error.

45. The signal processing circuit of claim 44, wherein the phase compensation data is provided to the means for adding for addition with the accumulated frequency error and the prior value of phase error to form the new value of accumulated phase error, in sample intervals coinciding with I and Q samples impacted by respective instances of gain switching.

46. The signal processing circuit of claim 41, further comprising:
   means for selecting a value of phase compensation data for each respective instance of switching corresponding to one of a plurality of possible switchings between discrete gain states; and
   means for supplying each selected value of phase compensation data to the means for frequency control processing for a single sample interval.

47. The signal processing circuit of claim 46, further comprising:
   means for causing the register to delay supplying the selected value of phase compensation data for the respective instance of gain switching to the means for frequency control processing for a period corresponding to a time of propagation of a sample subject to phase jump due to the respective instance of gain switching through the signal processing circuit to the means for frequency control processing.

48. A signal processing circuit, comprising:
   means for amplifying a received signal;
   means for frequency control processing of samples related to an amplified signal from the means for amplifying;
   means for detecting a parameter related to the received signal in response to the samples;
   means for controlling switching of the means for amplifying between discrete gain states based on the detected parameter;
   means for providing phase compensation data to the means for frequency control processing in response to each respective instance of switching of the means for amplifying between discrete gain states;
   means for compensating, based on the compensation data, for a phase jump due to the respective instance of switching of the means for amplifying between discrete gain states;
   wherein the means for amplifying comprises:
      means for amplifying a received radio-frequency (RF) signal; and
      means for downconverting, based on a zero intermediate frequency (ZIF) type downconversion, the amplified RF signal to baseband in-phase (I) and quadrature (Q) components; and
   wherein the samples are digital samples of the baseband I and Q components.

49. The signal processing circuit of claim 48, wherein the detected parameter is an integral of an error of an energy estimate of the received signal based on processing of the samples of the I and Q components.

50. The signal processing circuit of claim 48, wherein the means for frequency control processing comprises:
   means for accumulating a frequency error;
   means for accumulating a phase error;
   means for adding the accumulated frequency error to a prior value of phase error to form a new value of accumulated phase error in the phase accumulator; and
   means for providing sine and cosine values for multiplication of the I and Q samples in response to the new value of accumulated phase error.

51. The signal processing circuit of claim 50, wherein the phase compensation data is provided to the means for adding for addition with the accumulated frequency error and the prior value of phase error to form the new value of accumulated phase error, in sample intervals coinciding with I and Q samples impacted by respective instances of gain switching.

52. A signal processing circuit, comprising:
   means for amplifying a received signal;
   means for frequency control processing of samples related to an amplified signal from the means for amplifying;
   means for detecting a parameter related to the received signal in response to the samples;
   means for controlling switching of the amplifying means between discrete gain states based on the detected parameter;
   means for providing phase compensation data to the means for frequency control processing in response to each respective instance of switching of the means for amplifying between discrete gain states;
   means for compensating, based on the compensation data, for a phase jump due to the respective instance of switching of the means for amplifying between discrete gain states;
   means for selecting a value of phase compensation data for each respective instance of switching corresponding to one of a plurality of possible switchings between discrete gain states; and
   means for supplying each selected value of phase compensation data to the means for frequency control processing for a single sample interval.

53. The signal processing circuit of claim 52, further comprising:
   means for causing the register to delay supplying the selected value of phase compensation data for the respective instance of gain switching to the means for frequency control processing for a period corresponding to a time of propagation of a sample subject to phase jump due to the respective instance of gain switching through the signal processing circuit to the means for frequency control processing.

54. Computer readable storage media containing a set of instructions for a processor in a signal processing circuit that includes an amplifier having a controlled gain, for amplifying a received signal, and an automatic frequency control (AFC), for frequency control processing of samples related to an amplified signal from the amplifier, the set of instructions comprising:
   a routine to detect a parameter related to the received signal in response to the samples;
   a routine to control switching of the amplifier between discrete gain states based on the detected parameter;
   a routine for providing phase compensation data to the AFC in response to each respective instance of switching of the amplifier between discrete gain states, wherein, based on the phase compensation data, the AFC is configured to compensate for a phase jump due to the respective instance of switching of the amplifier between discrete gain states;
   a routine to amplify a received radio-frequency (RF) signal;
   a routine to perform a zero intermediate frequency (ZIF) type downconversion of the amplified RF signal to baseband in-phase (I) and quadrature (Q) components; and
   wherein the samples are digital samples of the baseband I and Q components.

55. The computer readable storage media of claim 54, wherein the detected parameter is an integral of an error of an energy estimate of the received signal based on processing of the samples of the I and Q components.

56. The computer readable storage media of claim 31, wherein the set of instructions further comprises:
   a routine to accumulate a frequency error;
   a routine to accumulate a phase error;

a routine to add the accumulated frequency error to a prior value of phase error in order to form a new value of accumulated phase error; and a routine to provide sine and cosine values for multiplication of the I and Q samples.

57. The computer readable storage media of claim 56, wherein the set of instructions further comprises:

a routine to supply the phase compensation data for addition with the accumulated frequency error and the prior value of phase error in order to form the new value of accumulated phase error, in sample intervals coinciding with I and Q samples impacted by respective instances of gain switching.

* * * * *

UNITED STATES PATENT AND TRADEMARK OFFICE
CERTIFICATE OF CORRECTION

PATENT NO. : 7,889,820 B2  Page 1 of 1
APPLICATION NO. : 11/393128
DATED : February 15, 2011
INVENTOR(S) : Murthy et al.

It is certified that error appears in the above-identified patent and that said Letters Patent is hereby corrected as shown below:

Column 20, line 40, claim 42: "(The signal" to read as --The signal--

Column 22, line 64, claim 56: "claim 31," to read as --claim 54--

Signed and Sealed this
Fifteenth Day of November, 2011

David J. Kappos
*Director of the United States Patent and Trademark Office*